United States Patent
Mason et al.

(10) Patent No.: US 9,876,298 B2
(45) Date of Patent: Jan. 23, 2018

(54) FLEXIBLE CONNECTOR AND METHODS OF MANUFACTURE

(71) Applicant: Tyco Electronics Corporation, Berwyn, PA (US)

(72) Inventors: Jeffery W. Mason, North Attleboro, MA (US); Wayne Stewart Alden, III, Whitman, MA (US); Chuan Yue, North Attleboro, MA (US)

(73) Assignee: TE Connectivity Corporation, Berwyn, PA (US)

( * ) Notice: Subject to any disclaimer, the term of this patent is extended or adjusted under 35 U.S.C. 154(b) by 443 days.

(21) Appl. No.: 14/450,361

(22) Filed: Aug. 4, 2014

(65) Prior Publication Data

US 2016/0036142 A1 Feb. 4, 2016

(51) Int. Cl.
| | |
|---|---|
| *H01R 12/78* | (2011.01) |
| *H01R 12/77* | (2011.01) |
| *H05K 1/18* | (2006.01) |
| *H05K 3/32* | (2006.01) |
| *H05K 1/02* | (2006.01) |

(52) U.S. Cl.
CPC ........... *H01R 12/78* (2013.01); *H01R 12/777* (2013.01); *H05K 1/189* (2013.01); *H05K 3/326* (2013.01); *H05K 1/028* (2013.01); *H05K 2201/0314* (2013.01); *H05K 2201/0367* (2013.01)

(58) Field of Classification Search
CPC ..................................................... H01R 12/62
See application file for complete search history.

(56) References Cited

U.S. PATENT DOCUMENTS

| | | | | |
|---|---|---|---|---|
| 3,526,867 A | * | 9/1970 | Keeler ................... | H01R 13/28 24/442 |
| 3,880,486 A | * | 4/1975 | Avakian ................. | H01R 9/091 174/262 |
| 3,971,610 A | * | 7/1976 | Buchoff ................. | G04C 3/005 174/254 |
| 3,982,320 A | | 9/1976 | Buchoff et al. | |
| 4,116,517 A | * | 9/1978 | Selvin .................... | H05K 3/365 29/846 |
| 4,125,310 A | * | 11/1978 | Reardon, II ......... | H01R 12/714 439/329 |

(Continued)

*Primary Examiner* — Neil Abrams

(57) ABSTRACT

A flexible connector includes a flexible substrate having a plurality of conductive pads and a plurality of conductive polymer springfingers. Each conductive polymer springfinger extends between a first end and a second end. The conductive polymer springfingers are mechanically and electrically connected to corresponding conductive pads at the corresponding second ends and the conductive polymer springfingers are configured to be mechanically and electrically connected to conductors of an electrical component at the corresponding first ends. The conductive polymer springfingers are internally conductive and compressible between the first and second ends. The conductive polymer springfingers are discrete and separated by gaps. The flexible substrate is flexible to allow the second ends of the conductive polymer springfingers to be non-coplanar and to allow the first ends of the conductive polymer springfingers to be non-coplanar for electrical connection with the electrical component.

26 Claims, 5 Drawing Sheets

(56) References Cited

U.S. PATENT DOCUMENTS

| | | | | |
|---|---|---|---|---|
| 4,184,729 A * | 1/1980 | Parks | H01R 12/62 | 29/830 |
| 4,239,312 A * | 12/1980 | Myer | H01L 23/481 | 257/E23.011 |
| 4,403,272 A * | 9/1983 | Larson | H01H 13/702 | 361/749 |
| 4,453,795 A * | 6/1984 | Moulin | H01R 13/2414 | 439/361 |
| 4,548,451 A * | 10/1985 | Benarr | H05K 3/326 | 29/848 |
| 4,813,129 A * | 3/1989 | Karnezos | H01R 13/2464 | 257/E23.021 |
| 4,891,014 A * | 1/1990 | Simpson | H05K 3/4007 | 29/846 |
| 5,090,118 A * | 2/1992 | Kwon | G01R 1/0735 | 29/843 |
| 5,102,342 A * | 4/1992 | Marian | H01R 12/79 | 439/260 |
| 5,118,299 A * | 6/1992 | Burns | H01L 23/32 | 439/290 |
| 5,163,834 A | 11/1992 | Chapin et al. | | |
| 5,180,311 A * | 1/1993 | Schreiber | H05K 3/4007 | 29/846 |
| 5,245,135 A * | 9/1993 | Schreiber | H05K 3/4007 | 174/261 |
| 5,265,329 A | 11/1993 | Jones et al. | | |
| 5,435,733 A * | 7/1995 | Chernicky | H05K 3/325 | 324/762.06 |
| 5,657,207 A * | 8/1997 | Schreiber | H01L 23/564 | 174/254 |
| 5,738,530 A * | 4/1998 | Schreiber | H01R 13/2414 | 439/66 |
| 5,899,757 A * | 5/1999 | Neidich | H05K 3/4015 | 439/67 |
| 6,056,557 A | 5/2000 | Crotzer | | |
| 6,296,493 B1 | 10/2001 | Michiya | | |
| 6,348,659 B1 * | 2/2002 | Crotzer | H01R 13/2414 | 174/68.1 |
| 6,428,327 B1 * | 8/2002 | Tamarkin | H01R 13/2421 | 439/67 |
| 6,434,817 B1 * | 8/2002 | Feigenbaum | H01L 21/563 | 257/E21.503 |
| 6,786,737 B2 * | 9/2004 | Tai | H05K 3/20 | 29/848 |
| 6,897,568 B2 * | 5/2005 | Haimerl | H01L 24/10 | 257/779 |
| 7,189,077 B1 * | 3/2007 | Eldridge | G01R 3/00 | 257/E21.582 |
| 7,462,939 B2 * | 12/2008 | Sundstrom | H01L 23/49827 | 174/260 |
| 7,473,102 B2 * | 1/2009 | Colgan | H01L 23/13 | 257/E23.004 |
| 7,549,870 B2 | 6/2009 | Mason et al. | | |
| 7,771,803 B2 * | 8/2010 | Daniel | B81B 3/0059 | 428/17 |
| 7,786,389 B2 * | 8/2010 | Tsukada | H05K 1/028 | 174/254 |
| 8,215,965 B2 | 7/2012 | Mizoguchi | | |
| 8,550,825 B2 | 10/2013 | Mason et al. | | |
| 8,641,428 B2 * | 2/2014 | Light | H05K 3/4069 | 439/66 |

\* cited by examiner

FLEXIBLE CONNECTOR AND METHODS OF MANUFACTURE

BACKGROUND OF THE INVENTION

The subject matter herein relates generally to flexible connectors for use between opposed arrays of contacts.

Interposers are used to provide electrical connection between two or more opposing arrays of contacts for establishing at least one electrical circuit, where the respective arrays may be provided on a device, printed circuit board, Land Grid Array (LGA), Ball Grid Array (BGA), and the like. In one interconnect technique, the electrical connection is provided by an interposer that is physically interposed between corresponding electrical contacts of the opposing arrays of contacts. Conventional interposers are positioned between planar arrays of contacts that are parallel to each other. However, there is a need for electrical connections between electrical components that are non-parallel.

BRIEF SUMMARY OF THE INVENTION

In one embodiment, a flexible connector is provided including a flexible substrate having a plurality of conductive pads and a plurality of conductive polymer springfingers. Each conductive polymer springfinger extends between a first end and a second end. The conductive polymer springfingers are mechanically and electrically connected to corresponding conductive pads at the corresponding second ends and the conductive polymer springfingers are configured to be mechanically and electrically connected to conductors of an electrical component at the corresponding first ends. The conductive polymer springfingers are internally conductive between the first and second ends. The conductive polymer springfingers are compressible between the first and second ends, and the conductive polymer springfingers are discrete and separated by gaps. The flexible substrate is flexible to allow the second ends of the conductive polymer springfingers to be non-coplanar and to allow the first ends of the conductive polymer springfingers to be non-coplanar for electrical connection with the electrical component.

In another embodiment, a flexible connector is provided including a flexible substrate having a plurality of conductive pads with a first securing member and a second securing member. A plurality of conductive polymer springfingers extend between a first end and a second end. The conductive polymer springfingers are mechanically and electrically connected to corresponding conductive pads at the corresponding second ends. The conductive polymer springfingers are configured to be mechanically and electrically connected to conductors of an electrical component at the first ends. The conductive polymer springfingers are internally conductive between the first and second ends. The conductive polymer springfingers are compressible between the first and second ends, and the conductive polymer springfingers are discrete and separated by gaps. A component holder is coupled to the first and second securing members. The component holder is configured to hold the electrical component. The flexible substrate and component holder are flexible and capable of being arranged non-parallel to allow the second ends of the conductive polymer springfingers to be non-coplanar and to allow the first ends of the conductive polymer springfingers to be non-coplanar for electrical connection with the electrical component.

In a further embodiment, a method of manufacturing a conductive polymer springfinger for use on a substrate as an electrical conductor is provided. The method includes providing a metal foil and positioning a mold over the metal foil. The mold has a plurality of openings and at least one of the openings is positioned over the metal foil. The method includes providing a blended polymer and metal particle composition and filling the openings with the blended polymer and metal particle composition. The method includes curing the blended polymer and metal particle composition to form conductive polymer springfingers. The method includes removing the mold leaving at least one of the conductive polymer springfinger mechanically and electrically connected to the metal foil.

DETAILED DESCRIPTION OF SPECIFIC EMBODIMENTS OF THE INVENTION

Figure 1:
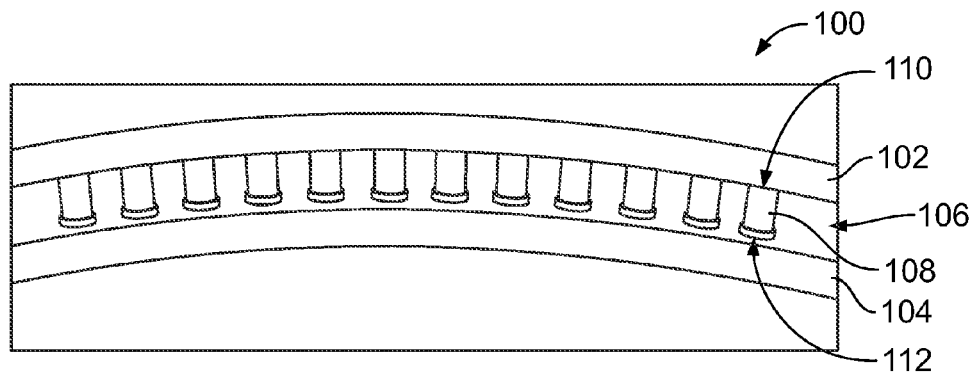
FIG. 1 illustrates an electrical interconnect system formed in accordance with an exemplary embodiment.

FIG. 1 illustrates an electrical interconnect system 100 formed in accordance with an exemplary embodiment. The system 100 includes a first electrical component 102, a second electrical component 104, and an interconnect device, such as a flexible connector 106, used to electrically interconnect the first electrical component 102 with the second electrical component 104. The flexible connector 106 includes one or more compressible conductors 108, which create a compressible interface between the first and second electrical components 102, 104. Optionally, the second electrical component 104 may be part of the flexible connector 106 (e.g., the flexible connector 106 includes the second electrical component 104), such that the second electrical component 104 of the flexible connector 106 is electrically coupled to the first electrical component 102 by one or more compressible conductors 108 of the flexible connector 106.

The first and second electrical components 102, 104 both have arrays of electrical conductors, such as conductive pads, land grid arrays, ball grid arrays and the like, which are electrically connected together by the flexible connector 106. The flexible connector 106 defines an interposer between the first and second electrical components 102, 104. The flexible connector 106 may include a single compressible conductor 108; however alternatively, as in the illustrated embodiment, the flexible connector 106 includes multiple compressible conductors 108 to create multiple electrical connections between the first and second electrical components 102, 104.

The flexible connector 106 has a first mating interface 110 and a second mating interface 112. The first mating interface 110 is configured to be electrically connected to the first electrical component 102. The second mating interface 112 is configured to be electrically connected to the second electrical component 104. In the illustrated embodiment, the first and second electrical components 102, 104 may be non-planar at the mating interfaces thereof. The flexible connector 106 may be non-planar in that the flexible connector 106 extends along a curved path. In an exemplary embodiment, at least one of the first and second electrical components 102, 104 is flexible and defines a bendable or curved mating interface. For example, the surfaces along which mating conductors (e.g., conductive pads) of the first and/or second electrical components 102, 104 are arranged are curved or bendable. The flexible connector 106 accommodates the curved profile of the first and/or second electrical components 102, 104.

Optionally, the flexible connector 106 and the second electrical component 104 may be permanently (e.g., non-removably) connected together, such as by a soldered connection, and the first mating interface 110 of the flexible connector 106 may define a separable mating interface for repeatedly mating to and unmating from the first electrical component 102. For example, the flexible connector 106 may define a compression connection with the first electrical component 102, which is solderless to allow unmating without damaging the flexible connector 106 or the first electrical component 102.

The flexible connector 106 may have applicability in numerous applications, such as for connection to flex circuits, in wearable devices, in bendable devices, and the like. In one particular example, the flexible connector 106 may be used in a wearable device, such as a watch, an athletic monitor, fashion electronics, clothing incorporating electronic technologies, accessories incorporating electronic technologies and the like. The flexible connector 106 may be used to make a power connection and/or a data connection within the wearable device. The wearable device may have a particular shape, such as a curved shape, that requires the flexible connector 106 to also have a curved shape. Having the flexible connector 106 approximate the shape of the wearable device as opposed to needing a planar space to fit in lessens the profile of the wearable device. Optionally, the wearable device may change shape when worn generally or when worn by different users. The flexible connector 106 may accommodate the change in shape and still maintain the electrical connection between the first and second electrical components 102, 104. For example, even if the first and/or second electrical component 102, 104 changes shape (e.g., a radius of curvature of the first and/or second electrical component 102, 104 increases or decreases), the compressible conductors 108 of the flexible connector 106 still maintain connection with the corresponding mating conductors (e.g., conductive pads) of the first and second electrical components 102, 104. For example, the size of the mating conductors and/or the compressible conductors 108 may be large enough to accommodate the flexing or bending while maintaining adequate overlap for electrical connection. Optionally, even if both the first and second electrical components 102, 104 are capable of changeable or alterable shape, each of the first and second electrical components 102, 104 may change shape differently such that the relative shapes of the first and second electrical components 102, 104 are not precisely the same. The flexible connector 106 may accommodate such relative change in shapes by flexing or bending between both the first and second electrical components 102, 104.

In another example, the flexible connector 106 may be used in a bendable electronic device, such as a bendable tablet, a bendable subscriber identification module (SIM) device, and the like. For example, the bendable device may be folded or rolled up for easy storage and then opened up for use, such as, in the example of the bendable SIM device, for insertion of a SIM card. The SIM card may be generally flat and rigid, but the bendable device may have a slight curvature after being opened up for use. The flexible nature of the flexible connector 106 allows for electrical connection to the SIM card. In other embodiments, the SIM card may be flexible (e.g., part of a flexible circuit) and may be insertable into the bendable device with the flexible connector 106 accommodating the non-planar nature of the bendable SIM card.

In another example, the first electrical component 102 or the second electrical component 104 may be a circuit integrated into a rigid structure. For example, the circuit may be integrated into a case or cover of an electronic device, such as a cell phone, a tablet, a computer; the circuit may be integrated into a structure, such as in a panel or frame of a component, such as a car; or the circuit may otherwise be provided on a surface that is non-planar. For example, the circuit may be printed or otherwise deposited directly on the non-planar surface. The flexible connector 106 is capable of following the curved or bent shape of the surface, and the other of the first or second electrical component 102 is able to be interconnected by the flexible connector 106. The flexible connector 106 accommodates tolerance mis-match between the first and second electrical components 102, 104, thus making manufacture of the components 102, 104 less expensive.

In an exemplary embodiment, the first electrical component 102 is an electronic package, such as a chip, processor, circuit card, and the like. The second electrical component 104 is a circuit board, such as a flex circuit. The flexible connector 106 includes a socket that is mounted to the flex circuit and is configured to receive the electronic package. In alternative embodiments, other types of electrical components may be interconnected by the flexible connector 106. For example, both the first and second electrical components 102, 104 may be circuit boards.

Figure 2:
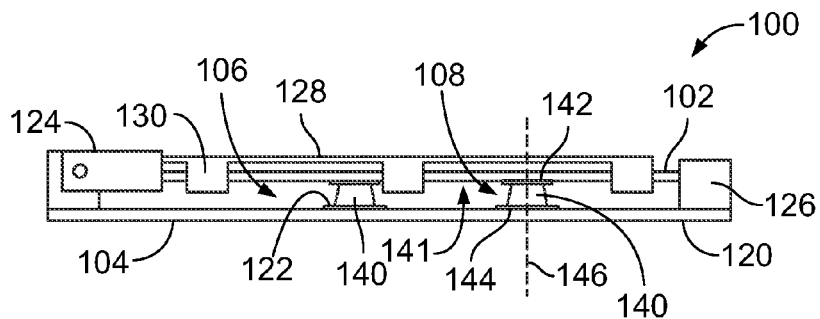
FIG. 2 illustrates the electrical connector system in accordance with an exemplary embodiment showing a first electrical component mated with a flexible connector and second electrical component.
Figure 3:
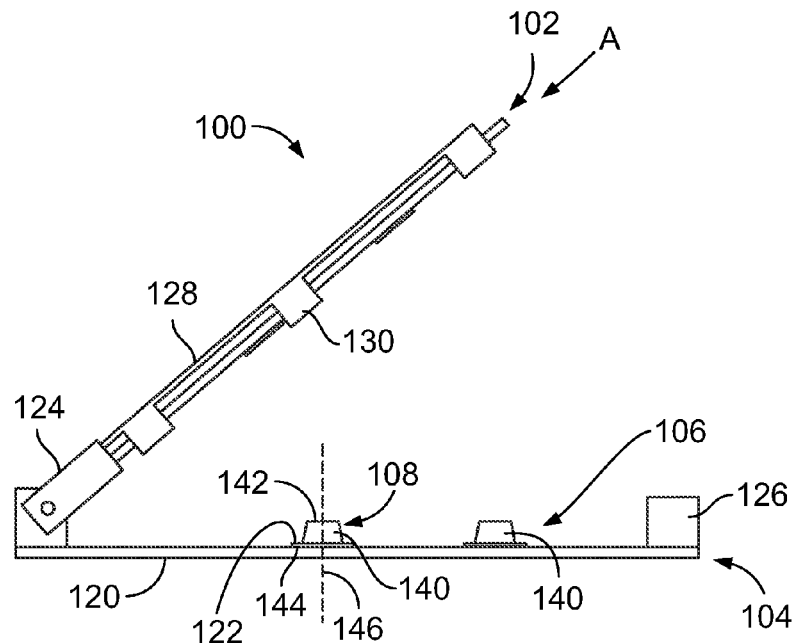
FIG. 3 illustrates the electrical interconnect system showing the first electrical component unmated from the flexible connector and second electrical component.
Figure 4:
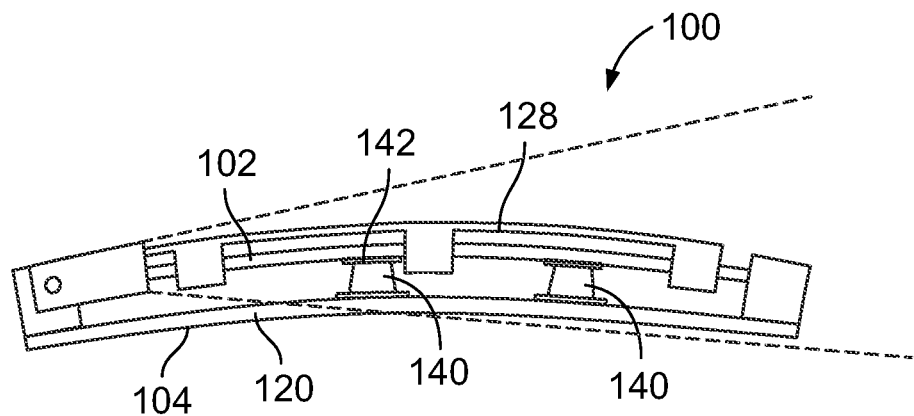
FIG. 4 illustrates the electrical interconnect system with the first and second electrical components in a curved or non-planar configuration.
Figure 5:
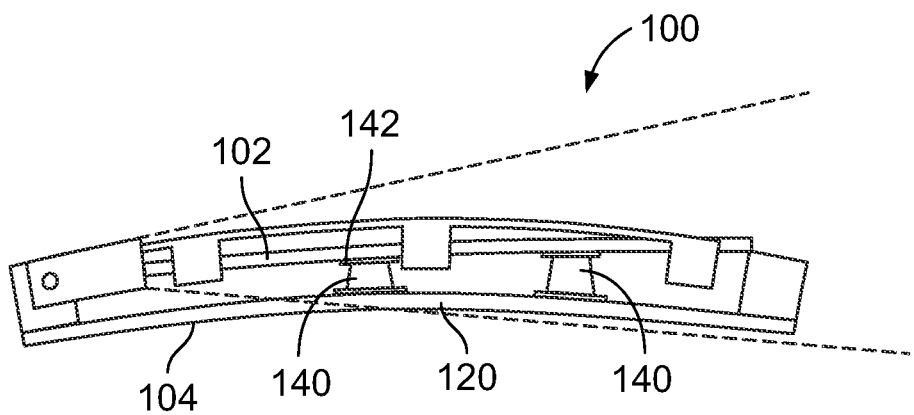
FIG. 5 illustrates the electrical interconnect system with the second electrical component and flexible connector in a curved or non-planar configuration, but with the first electrical component in a flat or planar configuration.

FIG. 2 illustrates the electrical connector system 100 in accordance with an exemplary embodiment showing the first electrical component 102 mated with the flexible connector 106 and second electrical component 104. FIG. 3 illustrates the electrical interconnect system 100 showing the first electrical component 102 unmated from the flexible connector 106 and second electrical component 104. FIGS. 2 and 3 illustrate the electrical interconnect system 100 with the first and second electrical components 102, 104 and the flexible connector 106 in a generally flat or planar configuration. FIG. 4 illustrates the electrical interconnect system 100 with the first and second electrical components 102, 104 in a curved or non-planar configuration. FIG. 5 illustrates the electrical interconnect system 100 with the second electrical component 104 and flexible connector 106 in a curved or non-planar configuration, but with the first electrical component 102 in a flat or planar configuration.

In an exemplary embodiment, the flexible connector 106 and second electrical component 104 are integrated into a single component configured to be electrically connected to the first electrical component 102. Such single component may be referred to as a flexible connector 106. As such, the flexible connector 106 may be said to include the electrical component 104.

In the illustrated embodiment, the first electrical component 102 is an integrated circuit, such as a SIM card. Optionally, the first electrical component 102 maybe referred to hereinafter as an integrated circuit component 102. Optionally, the integrated circuit component 102 may be rigid (FIG. 5) such that the integrated circuit component 102 remains flat or planar when coupled to the flexible connector 106. Alternatively, the integrated circuit component 102 may be flexible, such as a flex circuit, which may be bendable with the flexible connector 106.

The second electrical component 104 includes a substrate 120, which may be a flexible substrate such as a flex circuit. Other types of flexible substrates 120 may be used in alternative embodiments, such as a thin sheet of insulating material, such as a Kapton® sheet, that is used as a holder for the compressible conductors 108. Embodiments where the flexible substrate 120 is a flex circuit include a plurality of conductive pads 122. The conductive pads 122 may be part of circuit traces of the flex circuit. The compressible conductors 108 are electrically connected to corresponding conductive pads 122.

The second electrical component 104 includes a plurality of securing members, such as a first securing member 124 and a second securing member 126. The securing members 124, 126 may be used to secure the first electrical component 102 to the flexible connector 106.

In an exemplary embodiment, the second electrical component 104 includes a component holder 128 coupled to the first and second securing members 124, 126 to hold the integrated circuit component 102. When the component holder 128 is closed, the component holder 128 holds the integrated circuit component 102 in electrical contact with the flexible connector 106. In the illustrated embodiment, the component holder 128 is hingedly coupled to the first securing member 124 and the component holder 128 and/or the integrated circuit component 102 is latchably coupled to the second securing member 126. Other securing arrangements are possible in alternative embodiments, such as both securing members being latches, using clips, using fasteners, and the like, as well as combinations thereof.

In an exemplary embodiment, the component holder 128 is conductive and may define an electrical shield for the first electrical component 102. The component holder 128 includes a card slot that receives the first electrical component 102. For example, the component holder 128 may include tabs 130 that define the card slot to hold the first electrical component 102. The first electrical component 102 may slide into the card slot from the front of the component holder 128, such as in the direction of arrow A.

Optionally, the component holder 128 may be flexible. For example, the component holder 128 may be allowed to bend. The component holder 128 may be manufactured from a metal material or other materials, such as a nylon material. Optionally, the component holder 128 may be foldable and/or may be elastically deformed and configured to return to a normal shape, such as to hold the first electrical component 102. For example, the component holder 128 may be folded with the flexible substrate 120 for storage in a user's pocket, briefcase, and the like and then opened up or straightened to a generally flat condition during use.

The flexible connector 106 includes a plurality of the compressible conductors 108. In the illustrated embodiment, the compressible conductors 108 are conductive polymer springfingers 140; however other types of compressible conductors 108 may be used in alternative embodiment, such as metal springfingers. The conductive polymer springfingers 140 have a spring-like characteristic in that the conductive polymer springfingers 140 are capable of being elastically deformed. When the conductive polymer springfingers 140 are compressed and deformed, the conductive polymer springfingers 140 will exert force outwardly, such as against the first and second electrical components 102, 104. In an exemplary embodiment, the conductive polymer springfingers 140 are a blended polymer and metal particle composition. For example, the conductive polymer springfingers 140 may be metalized particle interconnects ("MPIs"). Optionally, the conductive polymer springfingers 140 may be columnar in shape defining conductive, compressible columns. Optionally, the compressible conductive polymer springfingers 140 may be frustoconically shaped. The conductive polymer springfingers 140 may be free-standing or independent or discrete from each other, such as with an air space or gap 141 between adjacent conductive polymer springfingers 140. For example, the conductive polymer springfingers 140 may only be held together by the thin flexible substrate 120, while the rest of the conductive polymer springfingers 140 are free-standing relative to each other. The conductive polymer springfingers 140 may be moved relative to each other when the flexible substrate 120 is bent or curved. For example, the tops or free ends of the conductive polymer springfingers 140 may be moved inward toward each other as the flexible substrate 120 is flexed inwardly or in a concave manner. Alternatively, the tops or free ends of the conductive polymer springfingers 140 may be moved outward away from each other as the flexible substrate 120 is flexed outwardly or in a convex manner. As such, the size of the gaps 141 may change as the flexible substrate is flexed.

The conductive polymer springfingers 140 are internally conductive. For example, the metal particles are conductive between a first end 142 and a second end 144 of the conductive polymer springfingers 140. The conductive polymer springfingers 140 extend along a central axis 146 between the first and second ends 142, 144. In an exemplary embodiment, the conductive polymer springfingers 140 are compressible generally along the central axis 146. The flexible substrate 120 is flexible to allow the central axis 146 of adjacent conductive polymer springfingers 140 to be non-parallel. When the flexible connector 106 and second electrical component 104 are bent or curved, the flexible substrate 120 is arranged along a curved path such that the second ends 144 are non-coplanar. For example, the second ends 144 may be arranged along a curved path. The flexible substrate 120 is flexible to allow the first ends 142 of the conductive polymer springfingers 140 to be non-coplanar, such as for mating to the first electrical component 102, which may be curved (FIG. 4) or flat (FIG. 5). For example, the first ends 142 may be arranged along a curved path.

For the conductive polymer springfingers 140, any type of polymer may be used, such as a silicon polymer that defines a matrix used to hold the metal particles. The metal particles may be silver particles, nickel particles, copper particles, metal plated particles, and the like. The blended polymer and metal particle composition may be mixed as a slurry or paste that may be molded to form the conductive polymer springfingers 140. The conductive polymer springfingers 140 have a large enough diameter to ensure alignment with, and electrical connection to, the mating conductors (e.g., the conductive pads) of the first and second electrical components 102, 104.

Figure 6:
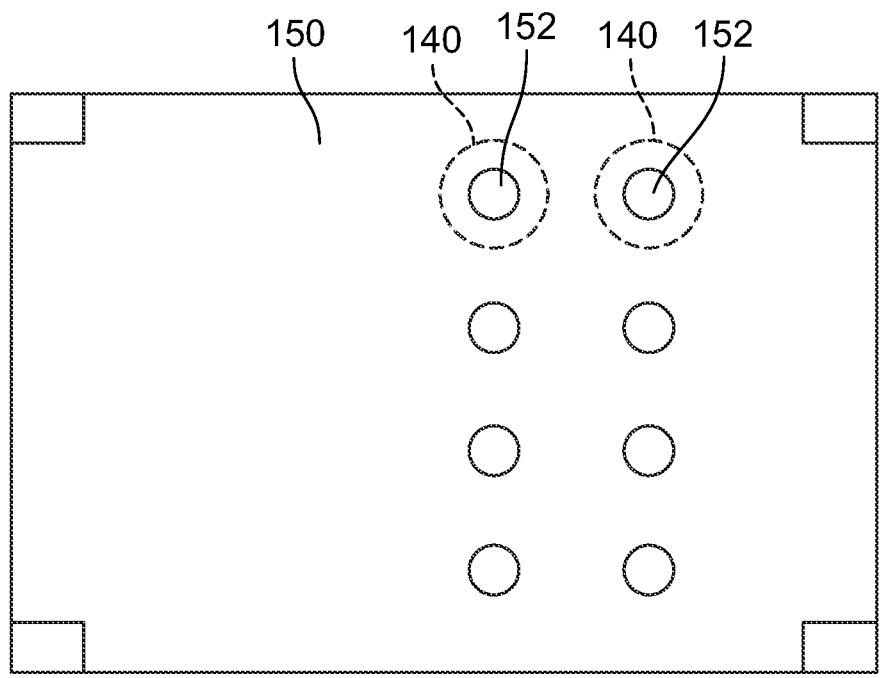
FIG. 6 is a bottom view of the first electrical component.

FIG. 6 is a bottom view of the first electrical component 102. The first electrical component 102 includes an insulative substrate 150 having a plurality of conductors 152 on surfaces thereof. The conductors 152 may be conductive pads and may be electrically connected to circuit traces of the substrate 150. An electronic device, module, or unit may be electrically connected to one or more of the conductors 152. The substrate 150 may be flexible. Alternatively, the substrate 150 may be a rigid substrate, such as a circuit board, a chip, a processor, and the like. FIG. 6 illustrates landing areas of corresponding conductive polymer springfingers 140 showing how the footprint of conductive polymer springfingers 140 is oversized relative to the conductor 152 to accommodate for misalignment due to variable flexing of the flexible conductor 106 and/or the first electrical component 102.

Figure 7:
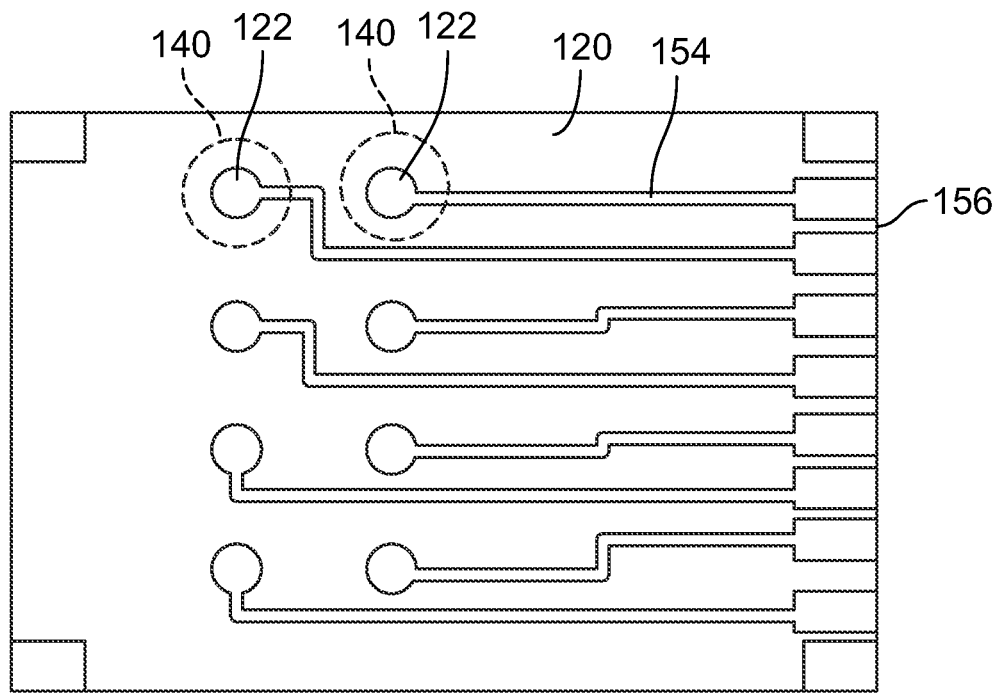
FIG. 7 is a top view of the second electrical component.

FIG. 7 is a top view of the second electrical component 104. The conductive pads 122 on the substrate 120 are shown electrically connected to corresponding circuit traces 154. The circuit traces 154 may be routed to an edge 156 of the substrate 120. Another electrical component or connector may be connected to the circuit traces 154 at the edge 156. FIG. 7 illustrates landing areas of corresponding conductive polymer springfingers 140 showing how the footprint of conductive polymer springfingers 140 is oversized relative to the conductive pads 122 to accommodate for misalignment due to variable flexing of the flexible conductor 106 and/or the second electrical component 102.

Figure 8:
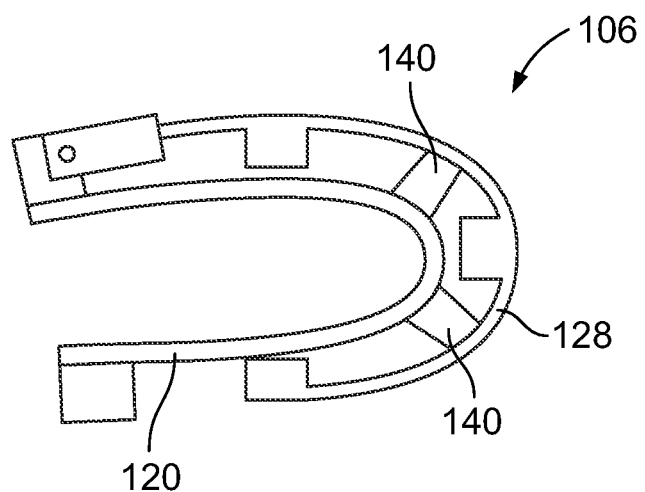
FIG. 8 illustrates the flexible connector in a folded condition.

FIG. 8 illustrates the flexible connector 106 in a folded condition. For example, the flexible connector 106 may be folded for storage, such as to be stored in a user's pocket. The flexible substrate 120 and the flexible component holder 128 may be stored in the folded condition in which at least a portion of the flexible substrate 120 and component holder 128 are folded over on another portion of the flexible substrate 120 and component holder 128. The flexible connector 106 may be straightened for mating with the first electrical component 102 (shown in FIG. 2). For example, the flexible substrate 120 and/or the component holder 128 may be elastically deformed when folded over and returned to a generally straightened condition for mating with the first electrical component 102. The conductive polymer springfingers 140 extend from the flexible substrate 120 and are not adversely affected by folding over of the flexible substrate 120. For example, the material of the flexible substrate 120 between adjacent conductive polymer springfingers 140 is folded over. The component holder 128 may protect the conductive polymer springfingers 140 from damage when the flexible connector 106 is folded over in the folded condition.

Figure 9:
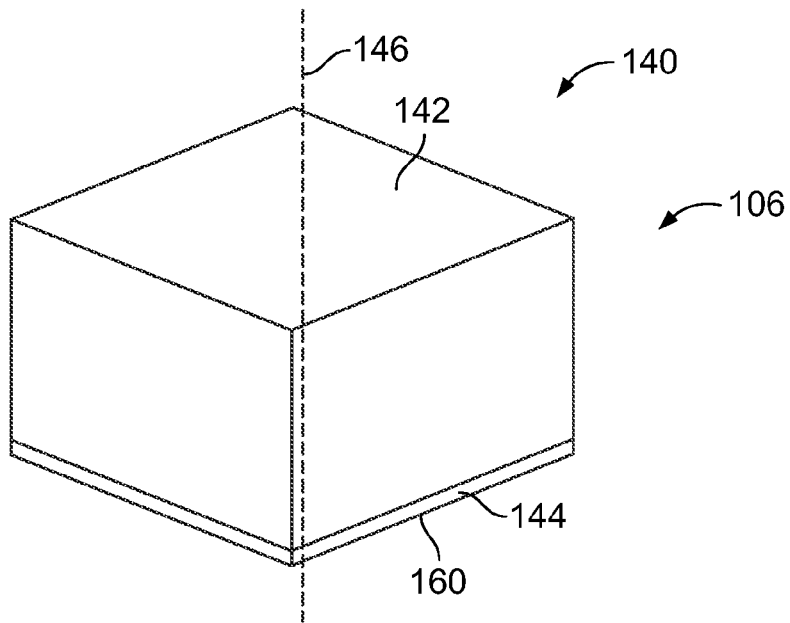
FIG. 9 illustrates a conductive polymer springfinger of the flexible connector formed in accordance with an exemplary embodiment.

FIG. 9 illustrates one of the conductive polymer springfingers 140 formed in accordance with an exemplary embodiment. The conductive polymer springfinger 140 extends along the central axis 146 between the first and second ends 142, 144. In an exemplary embodiment, the conductive polymer springfinger 140 includes a metal pad 160 at the second end 144. The metal pad 160 is configured to be soldered to a corresponding conductive pad 122 (shown in FIG. 2) of the substrate 120 (shown in FIG. 2). The metal particles of the conductive polymer springfinger 140 provide electrical conductivity through the conductive polymer springfinger 140 to the metal pad 160. As such, when the metal pad 160 is soldered to the conductive pad 122, the metal particles of the conductive polymer springfinger 140 are electrically connected to the conductive pad 122. In an exemplary embodiment, the conductive polymer springfinger 140 may be manufactured by molding the conductive polymer springfinger 140 directly onto the metal pad 160. The metal pad 160 may be cut or otherwise formed from a metal foil or metal sheet, either before or after fixing of the conductive polymer springfinger 140. When used alone as a single or individual conductive polymer springfinger 140 between the first and second electrical components 102, 104, the single conductive polymer springfinger 140 defines the flexible connector 106. Such single conductive polymer springfinger 140 does not necessarily need to be supported by any additional substrate, carrier or holder, but rather may be individually placed, and may be soldered in place on the second electrical component 104.

Figure 10:
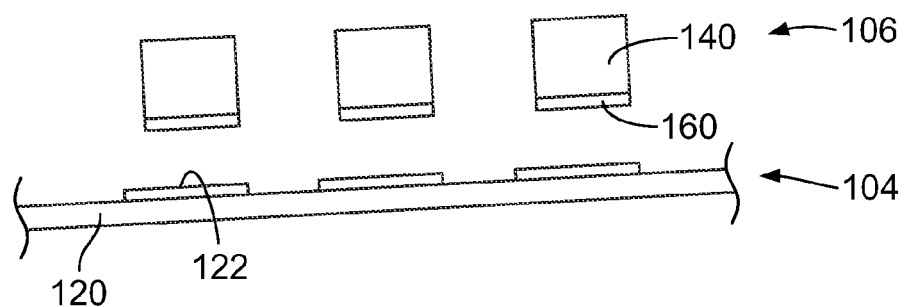
FIG. 10 illustrates a plurality of the conductive polymer springfingers with metal pads poised for mounting to the second electrical component.

FIG. 10 illustrates an embodiment having a plurality of the conductive polymer springfingers 140 with corresponding metal pads 160 poised for mounting to the second electrical component 104. For example, the individual conduct polymer springfingers 140 are positioned over corresponding conductive pads 122 on the flexible substrate 120. The metal pads 160 may be soldered to the conductive pads 122 to mechanically and electrically connect the conductive polymer springfingers 140 to the flexible substrate 120. The plurality of conductive polymer springfingers 140 defines the flexible connector 106.

Figure 11:
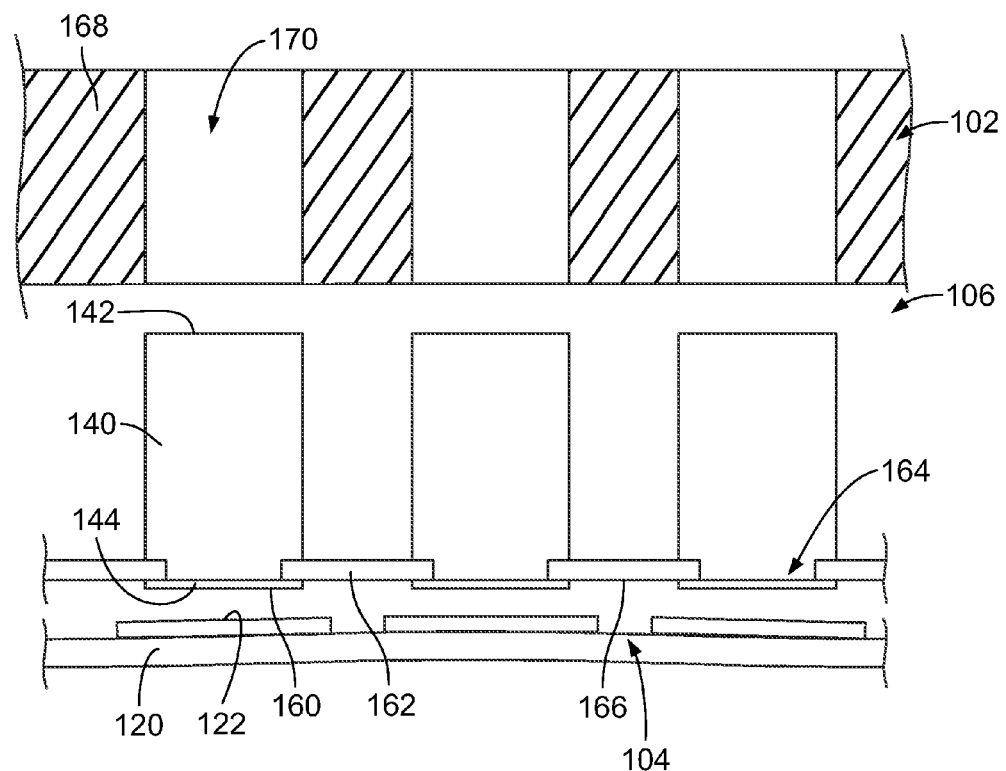
FIG. 11 illustrates the flexible connector including a plurality of the conductive polymer springfingers held together by a flexible carrier.

FIG. 11 illustrates the flexible connector 106 including a plurality of the conductive polymer springfingers 140 held together by a flexible carrier 162. The conductive polymer springfingers 140 and corresponding metal pads 160 are fixed to the flexible carrier 162. The flexible carrier 162 holds the relative positions of the conductive polymer springfingers 140. The flexible carrier 162 and corresponding conductive polymer springfingers 140 may be mounted to the second electrical component 104 as a unit. The metal pads 160 of the conductive polymer springfingers 140 may be soldered to corresponding conductive pads 122 of the substrate 120. In an exemplary embodiment, the conductive polymer springfingers 140 are molded and cured in place on the flexible carrier 162 and metal pads 160.

In an exemplary embodiment, during manufacture, the flexible carrier 162 is provided with a plurality of holes 164. The metal pads 160 are formed from one or more metal sheets or foils on the flexible carrier 162. For example, a surface 166 of the flexible carrier 162 may be covered by a metal foil. Portions of the metal foil are removed, such as by etching portions of the metal foil, leaving the metal pads 160 on the carrier 162. The holes 164 are aligned with the metal pads 160. The holes 164 may be formed by removing portions of the flexible carrier 162.

In an exemplary embodiment, during manufacture, a mold 168 is provided over the flexible carrier 162. The mold 168 has openings 170 aligned with corresponding holes 164 and metal pads 160. The openings 170 are filled with the blended polymer and metal particle composition. For example, the blended polymer and metal particle composition may be a paste or slurry that is cast, screened or otherwise placed or provided in the openings 170. The blended polymer and metal particle composition fills the openings 170 and holes 164. The blended polymer and metal particle composition engages the metal pads 160 such that the metal particles may be electrically connected to the metal pads 160.

In an exemplary embodiment, during manufacture, the blended polymer and metal particle composition is cured in place on the metal pads 160. The counter sunk holes 164 help hold the cured conductive polymer springfingers 140 in place on the flexible carrier 162. When the blended polymer and metal particle composition is cured, the metal particles are cross-linked and electrically connected with each other and the metal pads 160.

The flexible carrier 162 allows the conductive polymer springfingers 140 to move relative to each other, such as to bend along a curved surface, for mating with the first and or second electrical components 102, 104. According to a specific embodiment, having the blended polymer and metal particle composition cured onto the metal pads 160 eliminates any adhesive between the metal pads 160 and the conductive polymer springfingers 140. Good electrical connections can thus be established between the conductive polymer springfingers 140 and the metal pads 160 without having an adhesive interface therebetween.

In an alternative embodiment, rather than molding and curing the conductive polymer springfingers 140 onto the flexible carrier 162 and then attaching the conduct polymer springfingers 140 to conductive pads 122 of the substrate 120, the conductive polymer springfingers 140 may be molded and cured directly on the substrate 120. Such embodiments eliminate the need for a separate metal pad between the conductive polymer springfingers 140 and the conductive pads 122.

In other alternative embodiments, rather than interconnecting each of the conductive polymer springfingers 140 with the flexible carrier 162, the conductive polymer springfingers 140 may be molded directly to metal pads 160 without the flexible carrier 162 being connected therebetween. In such embodiments, when the mold is removed, discrete, separate conductive polymer springfingers 140 are provided. Such discrete conductive polymer springfingers 140 may be separately soldered to the second electrical component 104. Optionally, in such embodiments, the metal pads 160 may be initially held together as part of a common metal foil, wherein portions of the metal foil are removed after the mold is removed to separate the conductive polymer springfingers 140 and corresponding metal pads 160.

In other alternative embodiments, the flexible carrier 162 and metal pads 160 may be provided on the first ends 142 of the conductive metal springfingers 140 in addition to, or in lieu of, being provided on the second ends 144.

Figure 12:
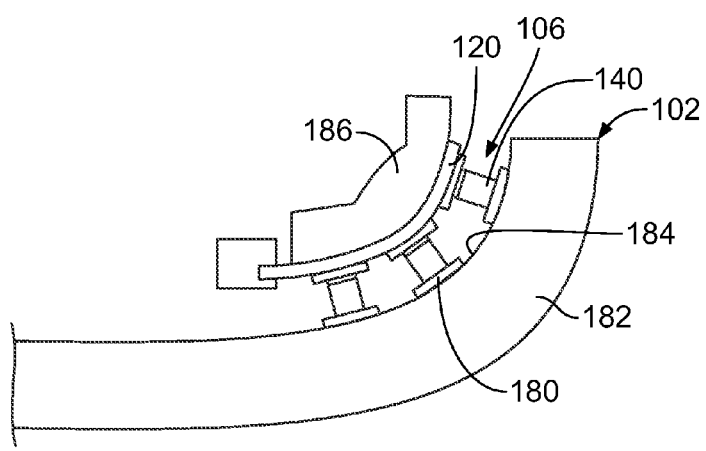
FIG. 12 illustrates the flexible connector being attached to the first electrical component.

FIG. 12 illustrates the flexible connector 106 being attached to the first electrical component 102. In the illustrated embodiment, the first electrical component 102 is defined by conductive pads 180 on a rigid panel 182. The rigid panel 182 has a curved surface 184 and the conductive pads are deposited on the curved surface 184. The flexible substrate 120 of the flexible connector 106 is able to follow the curvature of the surface 184. The conductive polymer springfingers 140 are positioned between the flexible substrate 120 and the surface 184 and are electrically connected to corresponding conductive pads 180. A component holder 186 may be used to hold the flexible connector 106 against the first electrical component 102.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A flexible connector comprising:
a flexible substrate having a plurality of conductive pads at a bendable mating interface; and
a plurality of conductive polymer springfingers, each extending between a first end and a second end, each conductive polymer springfinger extends along a central axis between the first and second ends, each conductive polymer springfinger being compressible along the corresponding central axis, the conductive polymer springfingers being mechanically and electrically connected to corresponding conductive pads at the corresponding second ends along the bendable mating interface, the conductive polymer springfingers being arranged along a curved mating interface for mechanically and electrically connecting to conductors of an electrical component at the curved mating interface, the conductive polymer springfingers being internally conductive between the first and second ends, the conductive polymer springfingers being compressible between the first and second ends, the conductive polymer springfingers being discrete and separated by gaps;
wherein the flexible substrate is flexible at the bendable mating interface to orient the central axes of adjacent conductive polymer springfingers in non-parallel orientations; and
wherein the flexible substrate is oriented with the second ends of the conductive polymer springfingers being non-coplanar along the bendable mating interface and with the first ends of the conductive polymer springfingers being non-coplanar for electrical connection with the electrical component at the curved mating interface.

2. The flexible connector of claim 1, wherein the flexible substrate and conductive polymer springfingers are configured to mate with conductors of the electrical component arranged along a bendable surface.

3. The flexible connector of claim 1, wherein the flexible substrate is arranged along a curved path such that the second ends are non-coplanar.

4. The flexible connector of claim 1, wherein the flexible substrate is configured to be stored in a folded condition in which at least a portion of the flexible substrate is folded over another portion of the flexible substrate, the flexible substrate being configured to be straightened for mating with the electrical component.

5. The flexible connector of claim 1, further comprising a securing member mounted to the flexible substrate, the securing member configured to secure the electrical component to the flexible substrate.

6. The flexible connector of claim 1, wherein the first ends comprise separable mating interfaces configured to be repeatedly mated to and unmated from the electrical component.

7. The flexible connector of claim 1, wherein the first ends are compressible toward the corresponding second ends when mated with the electrical component.

8. A flexible connector comprising:
a flexible substrate having a plurality of conductive pads; and
a plurality of conductive polymer springfingers, each extending between a first end and a second end, wherein the conductive polymer springfingers have metal pads at the second ends, the metal pads being soldered to the conductive pads of the flexible substrate to mechanically and electrically connect to corresponding conductive pads at the corresponding second ends, the conductive polymer springfingers being configured to be mechanically and electrically connected to conductors of an electrical component at the corresponding first ends, the conductive polymer springfingers being internally conductive between the first and second ends, the conductive polymer springfingers being compressible between the first and second ends, the conductive polymer springfingers being discrete and separated by gaps;
wherein the flexible substrate allows the second ends of the conductive polymer springfingers to be non-coplanar and allows the first ends of the conductive polymer springfingers to be non-coplanar for electrical connection with the electrical component.

9. The flexible connector of claim 8, wherein the conductive polymer springfingers have metal pads at the first ends being solderable to the conductors of the electrical component.

10. The flexible connector of claim 8, wherein each conductive polymer springfinger comprises a blended polymer and metal particle composition, the conductive polymer springfingers being cured in place on the metal pads such that the metal particles are crossed linked and electrically connected to the metal pads.

11. The flexible connector of claim 8, wherein the conductive polymer springfingers and corresponding metal pads are fixed to a flexible carrier and spaced apart from each other with the gaps therebetween, the flexible carrier holding the relative positions of the conductive polymer springfingers.

12. The flexible connector of claim 11, wherein the flexible carrier includes holes aligned with corresponding metal pads, the second ends of the conductive polymer springfingers filling the holes and being electrically connected to the metal pads, the first ends of the conductive polymer springfingers being free to move relative to each other to change relative positions of the first ends as the flexible carrier is flexed.

13. A flexible connector comprising:
a flexible substrate having a plurality of conductive pads, the flexible substrate having a first securing member and a second securing member;
a plurality of conductive polymer springfingers, each extending between a first end and a second end, the conductive polymer springfingers being mechanically and electrically connected to corresponding conductive pads at the corresponding second ends, the conductive polymer springfingers being configured to be mechanically and electrically connected to conductors of an electrical component at the first ends, the conductive polymer springfingers being internally conductive between the first and second ends, the conductive polymer springfingers being compressible between the first and second ends, the conductive polymer springfingers being discrete and separated by gaps; and
a component holder coupled to the first and second securing members, the component holder configured to hold the electrical component;
wherein the flexible substrate and component holder are flexible and capable of being arranged non-parallel to allow the second ends of the conductive polymer springfingers to be non-coplanar and to allow the first ends of the conductive polymer springfingers to be non-coplanar for electrical connection with the electrical component.

14. The flexible connector of claim 13, wherein the component holder is hingedly coupled to the first securing member, the second securing member being latchably coupled to the conductive holder.

15. The flexible connector of claim 13, wherein the component holder is conductive and defines an electrical shield for the electrical component.

16. The flexible connector of claim 13, wherein the component holder includes a SIM card slot configured to receive a SIM card defining the electrical component.

17. The flexible connector of claim 13, wherein the flexible substrate comprises a flex circuit having a plurality of circuit traces, each circuit trace terminating at the corresponding conductive pad, the conductive polymer springfingers being soldered to the conductive pads of the corresponding circuit traces.

18. The flexible connector of claim 17, wherein each conductive polymer springfinger includes a metal pad at the second end thereof, each conductive polymer springfinger includes a blended polymer and metal particle composition cured to the metal pad, the metal pad being soldered to the corresponding circuit trace.

19. The flexible connector of claim 17, wherein each conductive polymer springfinger includes a blended polymer and metal particle composition cured to the corresponding conductive pad of the flexible substrate.

20. The flexible connector of claim 13, wherein the component holder is flexible and configured to be elastically deformed.

21. The flexible connector of claim 8, wherein the flexible substrate and conductive polymer springfingers are configured to mate with conductors of the electrical component arranged along a bendable surface.

22. The flexible connector of claim 8, wherein the flexible substrate is arranged along a curved path such that the second ends are non-coplanar.

23. The flexible connector of claim 8, further comprising a securing member mounted to the flexible substrate, the securing member configured to secure the electrical component to the flexible substrate.

24. The flexible connector of claim 8, wherein the first ends comprise separable mating interfaces configured to be repeatedly mated to and unmated from the electrical component.

25. The flexible connector of claim 8, wherein each conductive polymer springfinger extends along a central axis between the first and second ends, each conductive polymer springfinger being compressible along the corresponding central axis, the flexible substrate being flexible to allow the central axis of adjacent conductive polymer springfingers to be non-parallel.

26. The flexible connector of claim 8, wherein the flexible substrate is configured to be stored in a folded condition in which at least a portion of the flexible substrate is folded over another portion of the flexible substrate, the flexible substrate being configured to be straightened for mating with the electrical component.

\* \* \* \* \*